(12) United States Patent
Worzyk

(10) Patent No.: US 11,467,224 B2
(45) Date of Patent: Oct. 11, 2022

(54) POWER CABLE MEASUREMENT SYSTEM

(71) Applicant: NKT HV Cables AB, Lyckeby (SE)

(72) Inventor: Thomas Worzyk, Lyckeby (SE)

(73) Assignee: NKT HV Cables AB, Lyckeby (SE)

( * ) Notice: Subject to any disclaimer, the term of this patent is extended or adjusted under 35 U.S.C. 154(b) by 0 days.

(21) Appl. No.: 17/281,875

(22) PCT Filed: Nov. 6, 2019

(86) PCT No.: PCT/EP2019/080380
§ 371 (c)(1),
(2) Date: Mar. 31, 2021

(87) PCT Pub. No.: WO2020/094710
PCT Pub. Date: May 14, 2020

(65) Prior Publication Data
US 2022/0011380 A1    Jan. 13, 2022

(30) Foreign Application Priority Data

Nov. 8, 2018 (EP) ...................... 18205158

(51) Int. Cl.
*G01R 31/58* (2020.01)
*H02G 15/02* (2006.01)

(52) U.S. Cl.
CPC ............. *G01R 31/58* (2020.01); *H02G 15/02* (2013.01)

(58) Field of Classification Search
CPC ......... G01R 31/58; G01R 31/50; H02G 15/02
See application file for complete search history.

(56) References Cited

U.S. PATENT DOCUMENTS 5,566,082 A * 10/1996 Suzuki ............... H02H 7/22
361/87
2011/0011987 A1 * 1/2011 Lessard ............... H02G 1/02
248/49

FOREIGN PATENT DOCUMENTS

| CN | 108092142 A | 5/2018 |
| EP | 1101262 A1 | 5/2001 |
| GB | 2331412 A | 5/1999 |
| JP | S5688606 A | 7/1981 |
| JP | 62221807 A | 9/1987 |

(Continued)

OTHER PUBLICATIONS

Extended European Search Report; Application No. 18205158.1; dated May 24, 2019; 8 Pages.

(Continued)

*Primary Examiner* — Feba Pothen
(74) *Attorney, Agent, or Firm* — Whitmyer IP Group LLC

(57) ABSTRACT

A power cable measurement system for facilitating measurements of a power cable terminated at an electrical substation and connected to an overhead busbar, including: a first movable structure provided with a first busbar connector, and a measurement equipment connector device configured to be electrically connected to the first busbar connector and to measurement equipment, wherein the first movable structure is configured to be maneuvered between a default lowered position in which the first busbar connector is disconnected from the overhead busbar, and a temporary elevated position in which the first busbar connector is set in electrical connection with the overhead busbar to provide an electrical connection between the overhead busbar and the measurement equipment connector device.

16 Claims, 3 Drawing Sheets

(56) References Cited

FOREIGN PATENT DOCUMENTS

| JP | H07270473 A | | 10/1995 | |
|---|---|---|---|---|
| KR | 20120014300 A | * | 2/2012 | |
| KR | 20170112819 A | | 10/2017 | |
| WO | WO-2018064754 A1 | * | 4/2018 | ......... G01R 19/2513 |

OTHER PUBLICATIONS

International Preliminary Report on Patenability; Application No. PCT/EP2019/080380; dated Feb. 16, 2021; 8 Pages.
International Search Report and Written Opinion of the International Searching Authority; Application No. PCT/EP2019/080380; Completed: Dec. 16, 2019; dated Jan. 8, 2020; 14 Pages.
Written Opinion of the International Preliminary Examining Authority; Application No. PCT/EP2019/080380; dated Sep. 23, 2020; 6 Pages.
European Search Report; Application No. 18205158.1; dated May 18, 2020; 2 Pages.

* cited by examiner

POWER CABLE MEASUREMENT SYSTEM

TECHNICAL FIELD

The present disclosure relates to power cables in general and in particular to power cable measurements.

BACKGROUND

A high voltage cable is typically terminated by means of a cable termination device. The cable termination device is provided with a connection point. The connection point may for example be a cylindrical round bolt or a connection plate provided with a bolt hole. The connection point can be connected to a busbar such as an overhead busbar of a substation. A substation in this context may for example be a high voltage direct current (HVDC) converter station or a transformer station.

An overhead busbar is an air insulated conductor suspended from hanging insulators or supported by support insulators. An overhead busbar may for example be a rigid tubular conductor or flat metallic conductor or wire. Normally, the overhead busbar is connected to a disconnector. The disconnector is normally operated manually from ground. When the disconnector is set in the closed position, the cable termination device and the power cable are electrically connected to the substation, enabling powering and operation of the cable length. When the disconnector is set in the open position, the cable termination device and the power cable are electrically isolated from the substation.

It may be necessary to perform various types of measurements on a power cable. In this case the power cable may have to be disconnected from the substation. Such measurements may be routine measurements but may also include measurements in the event of a fault along the cable length. In these cases, measurement equipment is connected to the power cable, in particular to the conductor of the power cable via the connection point of the cable termination device. The power cable must for this purpose be de-energized. This may be provided by setting the disconnector in the open position.

Depending on the rating of the power cable, the connection point of the cable termination and the overhead busbar may be located several meters above ground, such as 3-5 meters above ground for 175 kV rating and up to 9 meters above ground for 500 kV rating.

It is necessary to provide safe ascending devices for the operator to connect temporary measurement leads between ground-based measurement equipment and the connection point. This can easily be obtained in conjunction with planned service and maintenance work in the substation or of the power cable or cable termination device. In these cases, platforms may be built on site or motorized ascending devices such as aerial work platforms may be used. These aids are often sensitive for changes in weather conditions. The safety of personnel may for example be jeopardized by strong winds.

In the event of a cable failure along the length of the cable, fault localization often requires electrical measurements from the connection point of the cable termination device. Fault localization must be performed as soon as possible so that a repair team may be sent to the affected location along the cable length. In order to keep the downtime as short as possible, every hour that may be saved by means of fault localization is valuable.

The access time to the connection point of the cable termination device can be quite long due to external circumstances. It is furthermore especially difficult to obtain the necessary aids during weekends and at night when the substation is unmanned.

SUMMARY

In view of the above, a general object of the present disclosure is to provide a power cable measurement system which solves or at least reduces the problems of the prior art.

There is hence according to a first aspect of the present disclosure provided a power cable measurement system for facilitating measurements of a power cable terminated at an electrical substation and connected to an overhead busbar, comprising: a first movable structure provided with a first busbar connector, and a measurement equipment connector device configured to be electrically connected to the first busbar connector and to measurement equipment, wherein the first movable structure is configured to be maneuvered between a default lowered position in which the first busbar connector is disconnected from the overhead busbar, and a temporary elevated position in which the first busbar connector is set in electrical connection with the overhead busbar to provide an electrical connection between the overhead busbar and the measurement equipment connector device.

By means of the power cable measurement system fault searching/troubleshooting may be commenced shortly after a fault has occurred. There is no need to wait for portable equipment such as aerial work platforms or similar machines. A fault may hence be found quicker. The time until repair work may be performed can thereby be reduced considerably.

The power cable measurement system is preferably permanently installed. The power cable measurement system may be permanently installed near the cable termination device which terminates the power cable at the overhead busbar. The power cable measurement system may beneficially be permanently installed below the overhead busbar.

According to one embodiment the first busbar connector is provided in an end region of the first movable structure.

One embodiment comprises a motor configured to move the first movable structure between the default lowered position and the elevated position.

According to one embodiment the first movable structure is configured to be electrically isolated from ground.

One embodiment comprises a first busbar contact device configured to be mounted to the overhead busbar or a connection point of the terminated power cable and the overhead busbar, wherein the first busbar connector is configured to be connected to the first busbar contact device in the elevated position.

One embodiment comprises a base structure configured to be fixedly mounted to a support surface, wherein the first movable structure is movably attached to the base structure, wherein the default lowered position and the temporary elevated position are relative to the base structure.

One embodiment comprises a mechanical or electrical interlocking means configured to interlock the first movable structure in the default lowered position as long as the overhead busbar is non-grounded and to enable movement of the first movable structure from the default lowered position to the temporary elevated position only when the overhead busbar is grounded.

The mechanical or electrical interlocking means may prevent actuation of the first movable structure as long as the overhead busbar is non-grounded. The mechanical or electrical interlocking means may for example be configured to be connected to a grounding device configured to ground the overhead busbar, and based on the state of the grounding device prevent or enable actuation of the first movable structure For example, when the grounding device is in a non-grounding position the mechanical or electrical interlocking means may be configured to prevent actuation of the first movable structure, and when the grounding device is in a grounding position the mechanical or electrical interlocking means may be configured to enable actuation of the first movable structure.

A mechanical interlocking means may for example comprise a mechanical link and a switch. The mechanical link may be configured to be connected to the grounding device, and configured to actuate the switch between a first position and a second position depending on the state of the grounding device. The mechanical link may be configured to set the switch in the first position when the grounding device is in the grounding position. In the first position, the switch may enable actuation of the first movable member. The mechanical link may be configured to set the switch in the second position when the grounding device is in the non-grounding position. In the second position, the switch may prevent movement of the first movable member from the default lowered position.

An electrical interlocking means may for example comprise a switch and electrical wires connected to the grounding device, the wires being configured to convey control voltage signals/low voltage signals to actuate the switch between a first position and a second position depending on the state of the grounding device.

According to one embodiment the first movable structure is configured to move relative to the measurement equipment connector device when the first movable structure is maneuvered between the default lowered position and the elevated position.

According to one embodiment the power cable measurement system is designed to be installed stationarily in a substation environment.

There is according to a second aspect of the present disclosure provided a termination system for an electrical substation, comprising: a power cable, a cable termination device connected to the power cable, wherein the cable termination device is configured to be connected to an overhead busbar of the electrical substation, and a power cable measurement system according to the first aspect.

According to one embodiment the first movable structure is configured to be moved to the elevated position after the overhead busbar has been de-energized and grounded.

There is according to a third aspect of the present disclosure provided a method of performing a measurement of a power cable terminated at an electrical substation and connected to an overhead busbar, by means of a permanently installed power cable measurement system according to the first aspect, wherein the method comprises: a) disconnecting the power cable from the substation, b) connecting the power cable to ground, c) maneuvering a first movable structure provided with a first busbar connector electrically connected to a measurement equipment connector device from a default lowered position in which the first busbar connector is disconnected from the overhead busbar to an elevated position in which the first busbar connector is set in electrical contact with the overhead busbar to provide an electrical connection between the overhead busbar and the measurement equipment connector device.

One embodiment comprises d) connecting measurement equipment to the measurement equipment connector device, and e) disconnecting the power cable from ground to perform measurements.

One embodiment further comprises f) connecting the power cable to ground, and g) maneuvering the first busbar connector from the elevated position to the default lowered position.

According to one embodiment the first movable structure is moved from the default lowered position to the elevated position relative to the measurement equipment connector device which is stationary.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

Examples of the inventive concept will now be described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
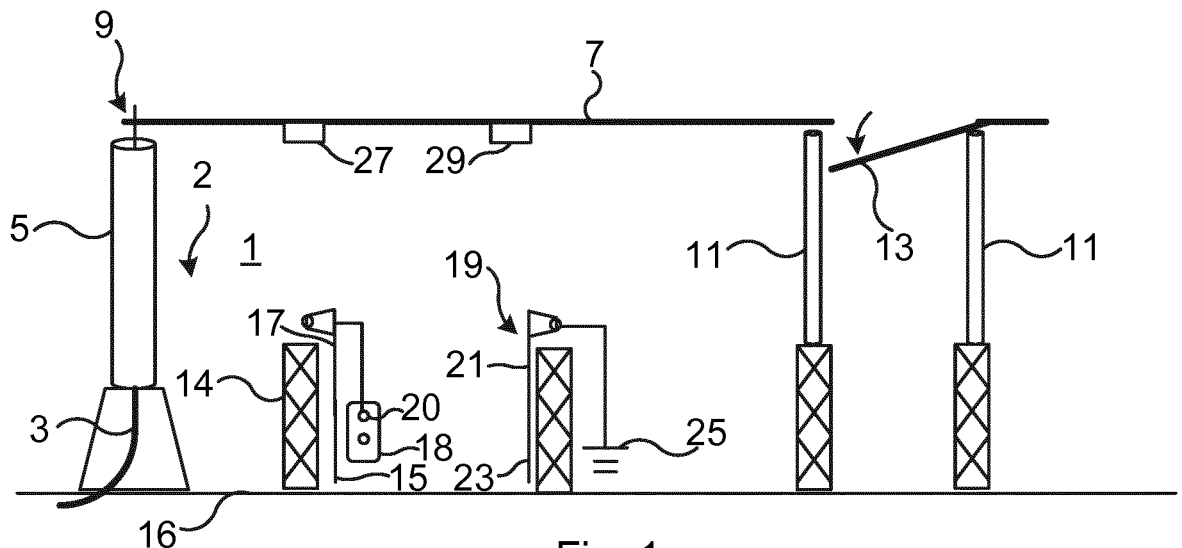
FIGS. 1-7 schematically show a power cable measurement system in different states of operation.

FIG. 1 shows an example of a power cable measurement system 1. The power cable measurement system 1 is designed and configured to be permanently installed in a power cable termination region, such as at an electrical substation.

FIG. 1 shows an example of a power cable termination region, such as an electrical substation, which includes a power cable 3, a cable termination device 5, an overhead busbar 7, and a grounding device 19. The power cable 3, the cable termination device 5, the power cable measurement system 1 and the grounding device 19 form a termination system 2.

The power cable 3 is connected to the cable termination device 5, which terminates the power cable 3 at the overhead busbar 7. To this end, an end portion of the power cable 3, in particular an end portion of its conductor is received by and electrically connected to the cable termination device 5. The cable termination device 5 is electrically connected to the overhead busbar 7. The connection between the cable termination device 5 and the overhead busbar 7 is referred to as the connection point 9. The connection point 9 may for example be formed by a cylindrical round bolt or a connection plate with bolt openings, for enabling connection of the cable termination device 5 to the overhead busbar 7.

The overhead busbar 7 is arranged above ground. In the example shown in FIG. 1, the overhead busbar 7 is supported by support insulators ii.

Alternatively, or additionally, the overhead busbar 7 could be suspended from hanging insulators. A disconnector 13 is configured to disconnect the power cable 3 from the electrical substation.

The power cable measurement system 1 comprises a base structure 14, and a first movable structure 17. The first movable structure 7 may be movably attached to the base structure 14. The base structure 14 may be configured to be permanently attached or fixedly mounted to a support surface/permanent support surface 16 such as the ground.

The first movable structure 17 may for example comprise one or more arms, levers, and/or a linkage. The first movable structure 17 may for example have a similar design to a knife switch. The first movable structure 17 has a first busbar connector 15. The first busbar connector 15 may be attached to or be integral with the first movable structure 17. The first busbar connector 15 is configured to be electrically isolated from ground. The first busbar connector 15 is preferably provided in an end region of the first movable structure 17. The first busbar connector 15 is configured to be connected to and configured to be disconnected from the overhead busbar 7. The first movable structure 17 is configured to be moved between a default lowered position relative to the base structure 14 in which the first busbar connector 15 is disconnected from the overhead busbar 7, as shown in FIG. 1, and a temporary elevated position relative to the base structure 14 in which the first busbar connector 15 is electrically connected to the overhead busbar 7. The first movable structure 17 may for example be configured to be moved by means of rotation or linear movement between the default lowered position and the temporary elevated position.

The power cable measurement system 1 may comprise a motor (not shown) configured to actuate the first movable structure 17. The motor may in particular be configured to move the first movable structure 17 between the default lowered position and the elevated position. Alternatively, or additionally, the power cable measurement system could comprise manual mechanical means for actuating the first movable structure.

The power cable measurement system 1 furthermore comprises a measurement equipment connector device 18. The measurement equipment connector device 18 is preferably configured to be installed stationarily relative to the first movable structure 17. The first movable structure 17 is hence configured to move relative to the measurement equipment connector device 18 when moved between the default lowered position and the elevated position. The first movable structure 17 is configured to be set in the elevated position only temporarily to provide an electrical connection between the overhead busbar 7 and the measurement equipment connector device 18. The measurement equipment connector device 18 has a measurement equipment connector 20, which may include one or more sockets or electrical connection points. The measurement equipment connector 20 is configured to be electrically connected to the first busbar connector 15. The measurement equipment connector 20 is configured to be connected to measurement equipment. Such measurement equipment may for example be devices suitable for cable fault localization, such as Time-domain reflectometry devices, Wheatstone bridges, failure burn down devices etc.

The grounding device 19 comprises a second movable structure 21. The second movable structure 21 may for example comprise one or more arms, levers, and/or a linkage. The second movable structure 23 may for example have a similar design to a knife switch. The second movable structure 21 has a second busbar connector 23. The second busbar connector 23 may be attached to or be integral with the second movable structure 21. The second busbar connector 23 is preferably provided in an end region of the second movable structure 21. The second busbar connector 23 is configured to be connected to and configured to be disconnected from the overhead busbar 7. The second movable structure 21 is configured to be moved between a non-grounding position in which the second busbar connector 23 is disconnected from the overhead busbar 7, as shown in FIG. 1, and a grounding position in which the second busbar connector 23 is electrically connected to the overhead busbar 7. When the second busbar connector 23 is electrically connected to the overhead busbar 7, the overhead busbar 7 and hence the power cable 3, is connected to electrical ground 25.

The power cable measurement system 1 may comprise a motor (not shown) configured to actuate the second movable structure 21. This motor may be the same motor as the one which is configured to actuate the first movable structure 17, or it may be a different motor. The motor may in particular be configured to move the second movable structure 21 between the non-grounding position and the grounding position. Alternatively, or additionally, the power cable measurement system could comprise manual mechanical means for actuating the second movable structure.

The power cable measurement system 1 may comprise a first busbar contact device 27. The first busbar contact device 27 may be configured to be attached to the overhead busbar 7 or to the connection point 9 between the cable termination device 5 and the overhead busbar 7. The first busbar contact device 27 may be configured to be permanently attached to the overhead busbar 7 or to the connection point 9 between the cable termination device 5 and the overhead busbar 7. The first busbar contact device 27 is configured to be connected to the first busbar connector 15. The first busbar contact device 27 is designed to ensure a reliable electrical connection between the overhead busbar 7 and the first busbar connector 15.

The power cable measurement system 1 may comprise a second busbar contact device 29. The second busbar contact device 29 may be configured to be attached to the overhead busbar 7 or to the connection point 9 between the cable termination device 5 and the overhead busbar 7. The second busbar contact device 29 may be configured to be permanently attached to the overhead busbar 7 or to the connection point 9 between the cable termination device 5 and the overhead busbar 7. The second busbar contact device 29 is configured to be connected to the second busbar connector 23. The second busbar contact device 29 is designed to ensure a reliable electrical connection between the overhead busbar 7 and the second busbar connector 23.

An example of the operation of the power cable measurement system 1 when the power cable 3 has been subjected to a fault will now be described with reference to FIGS. 1-7.

FIG. 1 illustrates a state in which the disconnector 13 is opened in order to de-energize the overhead busbar 7 and perform measurements to locate any fault along the power cable 3. The overhead busbar 7 is hence electrically isolated from the rest of the substation. In a step a) the power cable 3 is hence disconnected from the substation.

Figure 2:
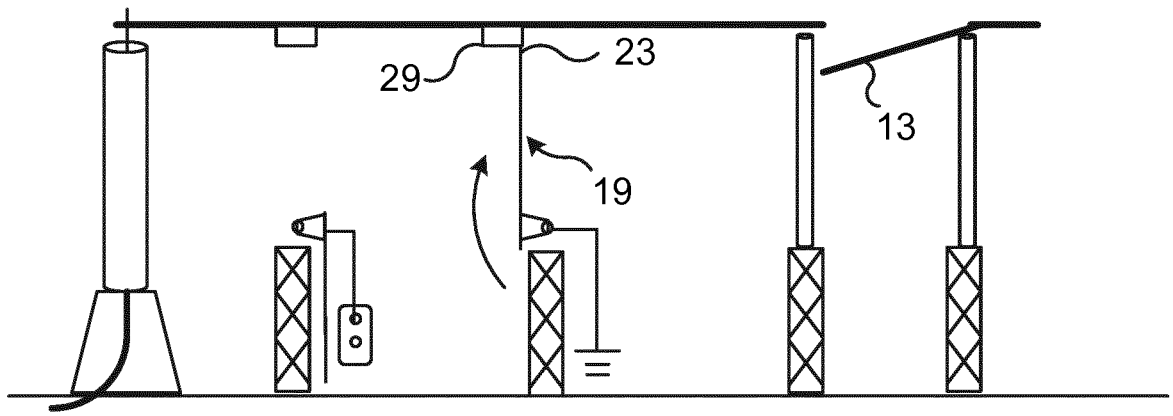

The power cable 3 is connected to ground in a step b), as shown in FIG. 2. In particular, the grounding device 19 is maneuvered from the non-grounding position shown in FIG.

1 to a grounding position in which the second busbar connector 23 is connected to the second busbar contact device 29. The overhead busbar 7 which is electrically isolated from the substation hence becomes connected to ground.

Figure 3:
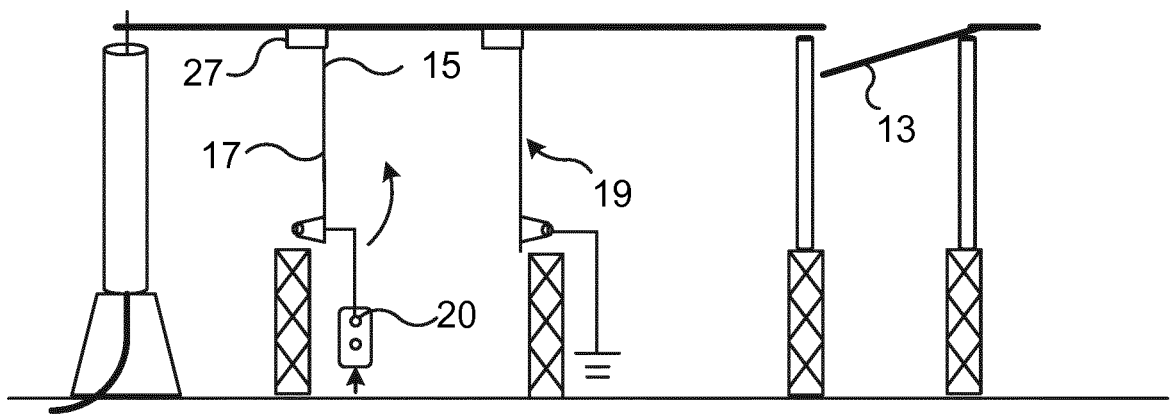

In FIG. 3, the first movable structure 17 is maneuvered from the default lowered position shown in FIGS. 1 and 2 to the elevated position in a step c). In the elevated position, the first busbar connector 15 is connected to the first busbar contact device 27. The grounding device 19 is maintained in the grounding position. Furthermore, the disconnector 13 is maintained in the open position. Measurement equipment may now in a step d) be connected to the measurement equipment connector device 20. Without the first movable structure 17 and the busbar contact device 27, the operator would have to wait for availability of an elevated work platform, operators for the platform, good weather, etc.

Figure 4:
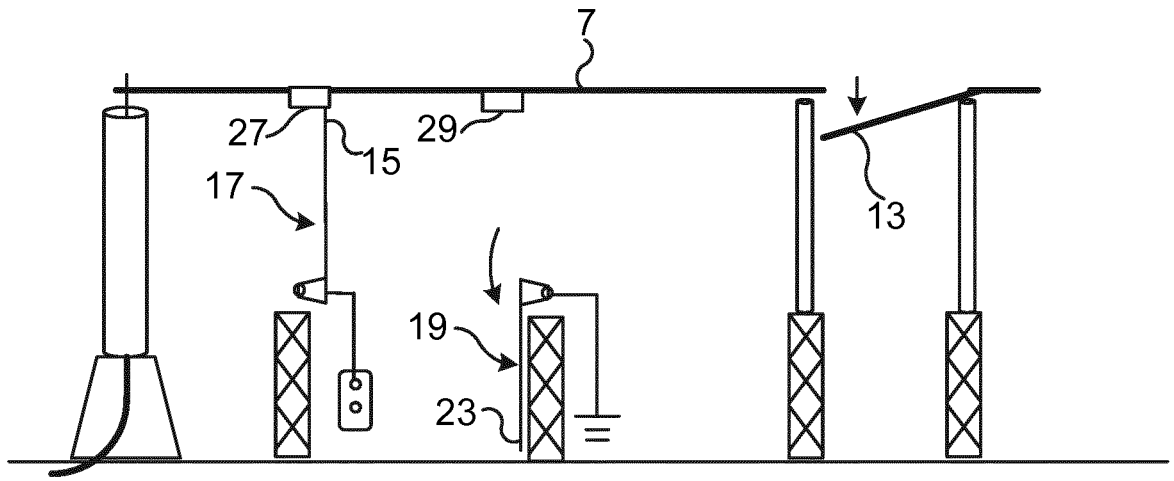

In FIG. 4, the grounding device 19 is moved from the grounding position to the non-grounding position in a step e). The second busbar connector 23 is hence disconnected from the second busbar contact device 29. The overhead busbar 7 and hence the power cable 3 are no longer grounded by means of the grounding device 19. Measurements may in this state be conducted to locate a fault. The disconnector 13 is maintained in the open position.

Figure 5:
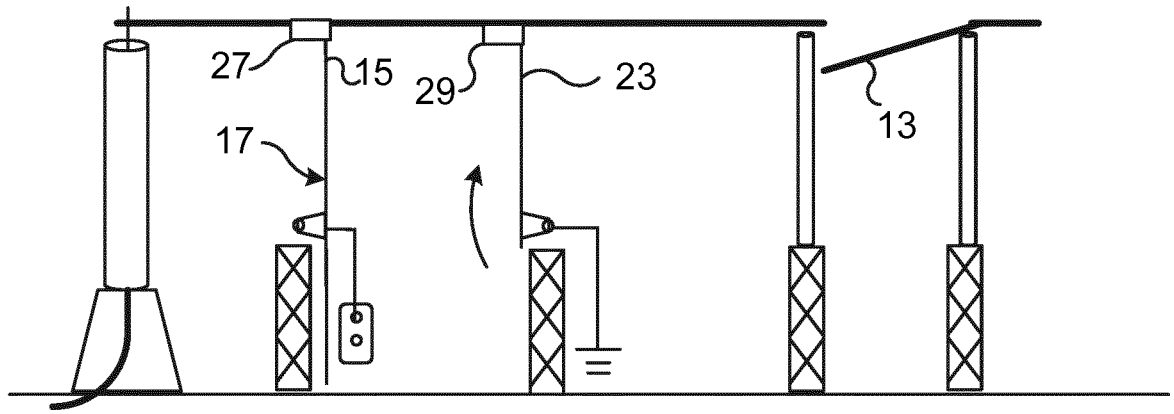

In FIG. 5, the grounding device 19 is moved from the non-grounding position to the grounding position in a step f). The second busbar connector 23 is hence connected to the second busbar contact device 29. Step f) is preferably performed after the measurements have been completed. The power cable 3 is hence again grounded. The disconnector 13 is maintained in the open position. The first movable structure 17 is maintained in the elevated position until the grounding device 19 has reached the grounding position. The first busbar connector 15 is hence maintained connected to the first busbar contact device 27.

Figure 6:
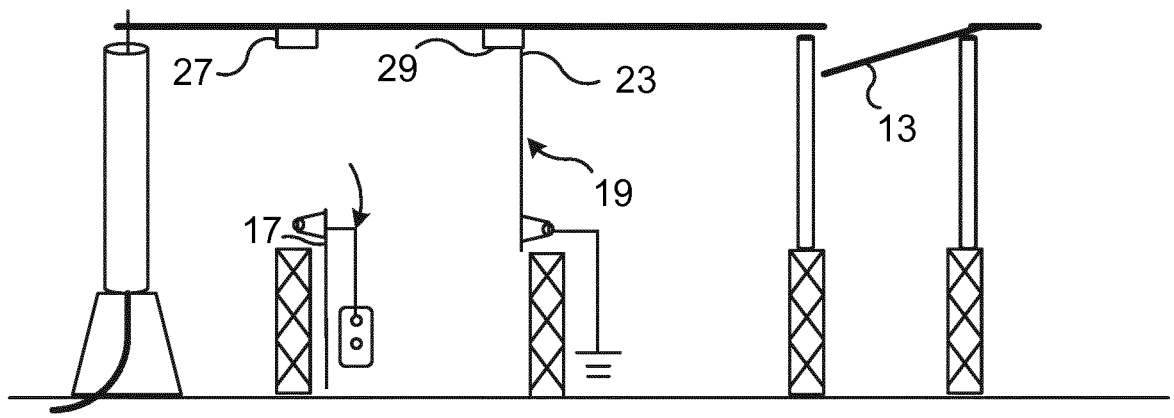

In FIG. 6, the first movable structure 17 is maneuvered from the elevated position to the default lowered position in a step g). The first busbar connector 15 is hence disconnected from the first busbar contact device 27. The grounding device 19 is maintained in the grounding position during this time. The second busbar connector 23 is hence connected to the second busbar contact device 29. The disconnector 13 is maintained in the open position.

Figure 7:
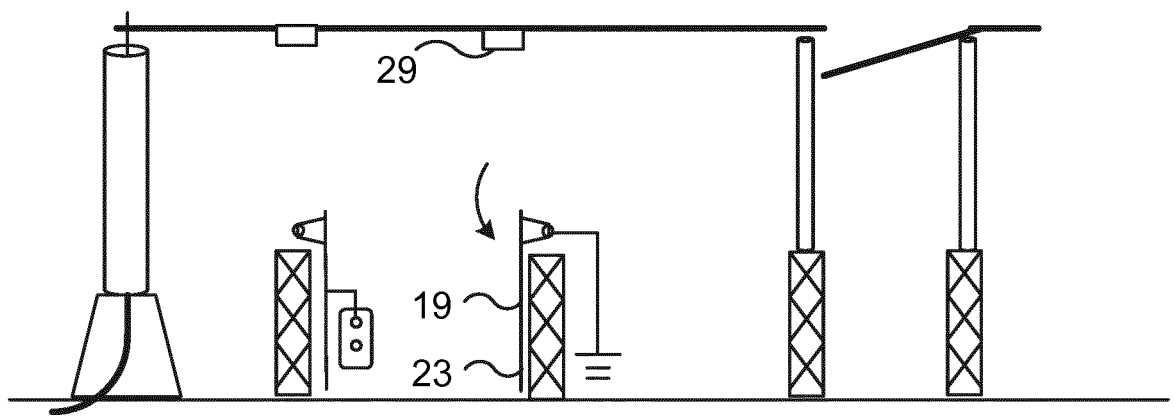

FIG. 7 shows a step h) in which the grounding device 19 is moved from the grounding position to the non-grounding position. The second busbar connector 23 is hence disconnected from the second busbar contact device 29. Step h) is typically performed once the fault has been addressed and the power cable 3 is again fully operational.

In general, once a fault has been localized by means of the measurements, service personnel may be sent for to remedy the fault.

Beneficially, a respective power cable measurement system 1 may be installed at each power cable termination of a substation.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A power cable measurement system for facilitating measurements of a power cable terminated at an electrical substation and connected to an overhead busbar, comprising:
a first movable structure provided with a first busbar connector, and
a measurement equipment connector device configured to be electrically connected to the first busbar connector and to measurement equipment,
wherein the first movable structure is configured to be maneuvered between a default lowered position in which the first busbar connector is disconnected from the overhead busbar, and a temporary elevated position in which the first busbar connector is set in electrical connection with the overhead busbar to provide an electrical connection between the overhead busbar and the measurement equipment connector device, and
wherein the power cable measurement system comprises a mechanical or electrical interlocking means configured to interlock the first movable structure in the default lowered position as long as the overhead busbar is non-grounded and to enable movement of the first movable structure from the default lowered position to the temporary elevated position only when the overhead busbar is grounded.

2. The power cable measurement system as claimed in claim 1, wherein the first busbar connector is provided in an end region of the first movable structure.

3. The power cable measurement system as claimed in claim 1, comprising a motor configured to move the first movable structure between the default lowered position and the elevated position.

4. The power cable measurement system as claimed in claim 1, comprising a first busbar contact device configured to be mounted to the overhead busbar or a connection point of the terminated power cable and the overhead busbar, wherein the first busbar connector is configured to be connected to the first busbar contact device in the elevated position.

5. The power cable measurement system as claimed in claim 1, comprising a base structure configured to be fixedly mounted to a support surface, wherein the first movable structure is movably attached to the base structure, wherein the default lowered position and the temporary elevated position are relative to the base structure.

6. The power cable measurement system as claimed in claim 1, wherein the first movable structure is configured to move relative to the measurement equipment connector device when the first movable structure is maneuvered between the default lowered position and the elevated position.

7. The power cable measurement system as claimed claim 1, wherein the power cable measurement system is designed to be installed stationarily in a substation environment.

8. A cable termination system for an electrical substation, comprising:
a power cable,
a cable termination device connected to the power cable, wherein the cable termination device is configured to be connected to an overhead busbar of the electrical substation, and
a power cable measurement system having:
a first movable structure provided with a first busbar connector, and
a measurement equipment connector device configured to be electrically connected to the first busbar connector and to measurement equipment,
wherein the first movable structure is configured to be maneuvered between a default lowered position in which the first busbar connector is disconnected from the overhead busbar, and a temporary elevated position in which the first busbar connector is set in electrical connection with the overhead busbar to provide an electrical connection between the overhead busbar and the measurement equipment connector device, and wherein the power cable measurement system comprises a mechanical or electrical interlocking means configured to interlock the first movable structure in the default lowered position as long as the overhead busbar is non-grounded and to enable movement of the first movable structure from the default lowered position to the temporary elevated position only when the overhead busbar is grounded.

9. The cable termination system as claimed in claim 8, wherein the first movable structure is configured to be moved to the elevated position after the overhead busbar has been de-energized and grounded.

10. A method of performing a measurement of a power cable terminated at an electrical substation and connected to an overhead busbar, by means of a permanently installed power cable measurement system comprising:

a first movable structure provided with a first busbar connector, and a measurement equipment connector device configured to be electrically connected to the first busbar connector and to measurement equipment, wherein the first movable structure is configured to be maneuvered between a default lowered position in which the first busbar connector is disconnected from the overhead busbar, and a temporary elevated position in which the first busbar connector is set in electrical connection with the overhead busbar to provide an electrical connection between the overhead busbar and the measurement equipment connector device; and wherein the method comprises:

a) disconnecting the power cable from the substation, b) connecting the power cable to ground, c) maneuvering the first movable structure provided with the first busbar connector electrically connected to the measurement equipment connector device from the default lowered position in which the first busbar connector is disconnected from the overhead busbar to the elevated position in which the first busbar connector is set in electrical contact with the overhead busbar to provide an electrical connection between the overhead busbar and the measurement equipment connector device.

11. The method as claimed in claim 10, comprising d) connecting measurement equipment to the measurement equipment connector device, and e) disconnecting the power cable from ground to perform measurements.

12. The method as claimed in claim 11, further comprising f) connecting the power cable to ground, and g) maneuvering the first busbar connector from the elevated position to the default lowered position.

13. The method as claimed in claim 10, wherein the first movable structure is moved from the default lowered position to the elevated position relative to the measurement equipment connector device which is stationary.

14. The power cable measurement system as claimed in claim 2, comprising a motor configured to move the first movable structure between the default lowered position and the elevated position.

15. The power cable measurement system as claimed in claim 2, comprising a first busbar contact device configured to be mounted to the overhead busbar or a connection point of the terminated power cable and the overhead busbar, wherein the first busbar connector is configured to be connected to the first busbar contact device in the elevated position.

16. The power cable measurement system as claimed in claim 2, comprising a base structure configured to be fixedly mounted to a support surface, wherein the first movable structure is movably attached to the base structure, wherein the default lowered position and the temporary elevated position are relative to the base structure.

* * * * *